US009209831B2

(12) United States Patent
Fuchs et al.

(10) Patent No.: US 9,209,831 B2
(45) Date of Patent: Dec. 8, 2015

(54) HARDWARE COMPRESSION TO FIND BACKWARD REFERENCES WITH MULTI-LEVEL HASHES

(71) Applicant: INTERNATIONAL BUSINESS MACHINES CORPORATION, Armonk, NY (US)

(72) Inventors: Thomas Fuchs, Bietigheim-Bissingen (DE); Christian Jacobi, Poughkeepsie, NY (US); Reiner Rieke, Althengstett (DE); Joerg-Stephan Vogt, Holzgerlingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/665,376

(22) Filed: Mar. 23, 2015

(65) Prior Publication Data

US 2015/0280738 A1 Oct. 1, 2015

(30) Foreign Application Priority Data

Mar. 25, 2014 (GB) .................................. 1405315.1

(51) Int. Cl.
*H03M 7/34* (2006.01)
*H03M 7/30* (2006.01)

(52) U.S. Cl.
CPC .................................. *H03M 7/3088* (2013.01)

(58) Field of Classification Search
CPC ............ H03M 7/3084; H03M 7/3086; H03M 7/3088; H03M 7/7093
USPC .............................................. 341/50–51, 87
See application file for complete search history.

(56) References Cited

U.S. PATENT DOCUMENTS 5,140,321 A 8/1992 Jung
5,159,336 A 10/1992 Rabin et al.
(Continued)

FOREIGN PATENT DOCUMENTS

EP         0677927  A2    4/1995
WO    WO9317503  A1    9/1993
WO    WO2009141677  A2    11/2009

OTHER PUBLICATIONS

Search Report for GB1405315.1 dated Sep. 22, 2014, 4 pages.
(Continued)

*Primary Examiner* — Khai M Nguyen
(74) *Attorney, Agent, or Firm* — Margaret McNamara, Esq.; Blanche E. Schiller, Esq.; Heslin Rothenberg Farley & Mesiti P.C.

(57) ABSTRACT

Concurrently writing an uncompressed data element, if the uncompressed data element comprises an indication that it is valid, in a main hash table using a first address generated by a first hash function, and reading a first data element from the main hash table using the first address. Introducing a first pipeline delay for maintaining the uncompressed data element in a first data path until the first data element is read. Concurrently writing the first data element to a victim hash table, if the first data element comprises an indication that it is valid, using a second address generated by a second hash function, and reading a second data element from the victim hash table using a third address generated by the second hash function. Introducing a second pipeline delay for maintaining the uncompressed data element in the first data path until the second data element is read.

20 Claims, 3 Drawing Sheets

(56) References Cited

U.S. PATENT DOCUMENTS

| | | | |
|---|---|---|---|
| 5,371,499 A | | 12/1994 | Graybill et al. |
| 5,406,279 A | * | 4/1995 | Anderson et al. ............... 341/51 |
| 5,970,177 A | | 10/1999 | Chinnock |
| 6,008,743 A | | 12/1999 | Jaquette |
| 6,624,762 B1 | | 9/2003 | End, III |
| 7,043,494 B1 | * | 5/2006 | Joshi et al. ............................ 1/1 |
| 7,185,041 B1 | * | 2/2007 | End, III ......................... 708/656 |
| 7,538,695 B2 | * | 5/2009 | Laker et al. ..................... 341/51 |
| 7,719,443 B1 | | 5/2010 | Natanzon |
| 8,704,686 B1 | | 4/2014 | Agarwal et al. |

OTHER PUBLICATIONS

International Search Report for GB1405314.4 dated Sep. 22, 2014, pp. 1-4.

Fuchs, Thomas et al., "Improving a Compression Ratio for a Compression Engine," U.S. Appl. No. 14/665,325, filed Mar. 23, 2015, pp. 1-30.

List of IBM Patents or Patent Applications Treated as Related, Apr. 6, 2015, pp. 1-2.

* cited by examiner

HARDWARE COMPRESSION TO FIND BACKWARD REFERENCES WITH MULTI-LEVEL HASHES

PRIOR FOREIGN APPLICATION

This application claims priority from United Kingdom patent application number 1405315.1, filed Mar. 25, 2014, which is hereby incorporated herein by reference in its entirety.

BACKGROUND

One or more aspects relate generally to data processing systems and more specifically to hardware compression.

Many compression algorithms, such as LZ77, rely on finding maximum length re-occuring byte sequences. The Deflate standard defines a minimum 3 bytes length backward reference. Therefore, hash functions must calculate the addresses to access a hash table based on a series of 3 bytes. This means any n-byte sequence that starts with the same 3 bytes will result in the same address, which will cause hash collisions, and thus, reducing the compression ratio.

SUMMARY

One aspect relates to a method for processing an uncompressed data element received in a stream of data elements by a hardware logic system having a multi-stage pipeline structure and a distributed memory comprising a main hash table and at least one victim hash table. The method comprises, for instance, a) concurrently writing the uncompressed data element, if the uncompressed data element comprises an indication that it is a valid data element, in the main hash table using a first address generated by a first hash function from the uncompressed data element, and reading a first data element from the main hash table using the first address; b) introducing a first pipeline delay for at least one clock cycle for maintaining the uncompressed data element in a first data path until the first data element is read; c) concurrently writing the first data element to the victim hash table, if the first data element comprises an indication that it is a valid data element, using a second address generated by a second hash function from the first data element, and reading a second data element from the victim hash table using a third address generated by the second hash function from the uncompressed data element; d) introducing a second pipeline delay for at least one clock cycle for maintaining the uncompressed data element in the first data path until the second data element is read; e) selecting a data element from at least the first and second data elements having a longest sequence that matches at least part of the uncompressed data element, if the uncompressed data element and at least one of the first and second data elements comprise an indication that they are valid data elements; and f) using the longest matching sequence for providing the uncompressed data element in a compressed format backward referring to the longest matching sequence.

Another aspect relates to a data processing system for processing an uncompressed data element received in a stream of data elements, the data processing system comprising a hardware logic system having a multi-stage pipeline structure and a distributed memory comprising a main hash table, and at least one victim hash table. The data processing system is adapted for performing steps a)-f).

BRIEF DESCRIPTION OF THE SEVERAL VIEWS OF THE DRAWINGS

In the following, embodiments of the invention will be described in greater detail by way of example only making reference to the drawings in which.

DETAILED DESCRIPTION

Figure 1:
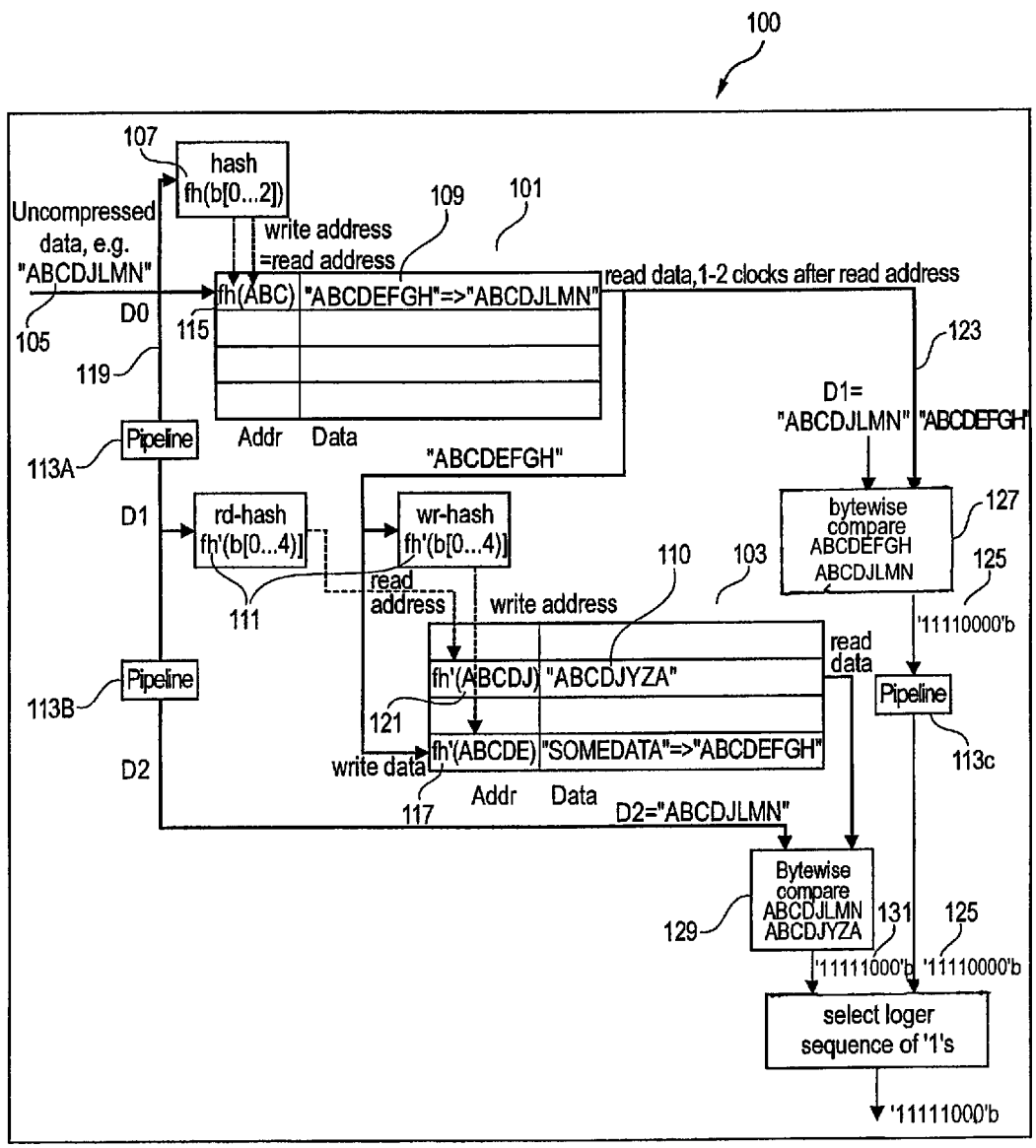
FIG. 1 is an exemplary hardware block diagram of a data processing system for processing an uncompressed data element.

In the following, like numbered elements in the figures either designate similar elements or designate elements that perform an equivalent function. Elements which have been discussed previously will not necessarily be discussed in later figures if the function is equivalent.

The term "data element" as used herein refers to a predetermined number of bits or bytes of data of a data unit. The data element may be transmitted through a data path to, and/or output from, a functional block, during a single execution cycle of the functional block. For example, a 100 byte data unit may be transmitted as a series of ten data elements with each data element containing ten bytes.

The term "compression ratio" as used herein refers to the data compression ratio which is defined as the ratio between the uncompressed size and compressed size of data.

The term "string" as used herein refers to an ordered sequence of symbols or binary data. Strings may include a string of text, binary data, or a combination thereof. String data has a length that may be measured in terms of bytes.

The term "concurrent" as used herein pertains to the occurrence of two or more activities within a given interval of time. For example, the two or more activities may occur in parallel.

The term "pipeline" as used herein refers to a circuit partitioned into separate clocked registers by stages. If each stage takes one clock cycle, the processing time of the pipeline is the number of stages in the pipeline. Different stages can perform their function (e.g., execute different instructions) in parallel, wherein data (including instructions) are sequentially supplied from an input and obtained from an output after being processed in the different stages. The term "pipeline delay" refers to a number of clock cycles needed in addition to the processing time of the pipeline for the pipeline to process an instruction assuming the instruction is not stalled.

The term "valid data element" as used herein refers to a first data element of a given data unit that can be used for matching at least part of its sequence of bytes with at least a second data element of the given data unit such that the compression format of the first data element may comprise a valid backward reference to the second data element.

The term "hash collision" as used herein refers to the writing of a data element into a given hash table using a memory address that has been already used to write another data element in the hash table. Therefore, the hash collision happens when the already existing data element is overwritten.

The term "matching" refers to the process of, given a data element of a data unit and a pattern of the given data element, finding occurrences of the pattern in previous bytes in the data unit that have been processed before processing the given data element.

The features of one or more aspects may allow an improved compression ratio of a compressed data format of the data being processed by the present aspects. This may save storage space that would otherwise be required when processing the data using a less performant matching device e.g. a matching device using a single hash table.

For example, hash collisions at the main hash table may be avoided by moving an overwritten victim data element of the main hash table to the victim hash table. This may increase the initial sample of data elements that is used for matching with the uncompressed data element. In other terms, the overwritten victim data element is still taken into account for matching with the uncompressed data element which may then increase the length of the matching sequence e.g. if the longest matching sequence is in the overwritten victim data element.

Further, one or more aspects may provide reliable and accurate results even in cases where the stream of data elements comprises intermediate invalid data elements e.g. because the stream of data has been interrupted or corrupted etc. This is because the comparison results where an invalid data element is involved are invalid results that may not lead to a valid matching sequence. In addition, an invalid data element is not written in the main and the victim hash tables such that it does not affect the backward search when decompressing a compressed format of data that has been processed by the present aspect.

For example, in synchronous hardware designs, new data arrives every clock cycle. If there's no new data available (e.g. throttling, waiting for disk or I/O), the data gets marked as an "idle" cycle or "invalid". The present pipeline structure is tailored specially to make sure any sequence of cycles with valid and invalid data produces the same sequence of valid outputs.

Hence, the results provided by the one or more aspects may be stable and thus predictable. The results may then be useful for evaluating the performance of the data processing system. Also, multiple runs with the same input data should not produce different output data. In other terms, without the present pipeline structure the logic would find different matches depending on the sequence of valid and invalid data elements. Therefore, the combination of the pipeline structure with the victim hash tables allows for getting better matching byte sequences while still processing data predictably under all throttling conditions.

According to one embodiment, the first address is generated from a first portion of the uncompressed data element and the third address is generated from a second portion of the uncompressed data element, wherein the first portion is encoded in the leftmost bytes of the second portion. This embodiment may provide a reliable matching method that makes use of the hierarchy of two hash tables. Also, it may provide the longest matching sequence compared to other combinations of the first and second portions of the uncompressed data element.

According to one embodiment, steps a), c), e) and f) are processed at a rate of one step per clock cycle.

For example, the reading and the writing of step a) may start in a clock cycle.

For example, the reading and the writing of step c) may start in a clock cycle.

According to one embodiment, step c) further comprises concurrently performing a first byte-wise comparison between the first data element and the uncompressed data element, and introducing after step c) a third pipeline delay for at least one clock cycle for maintaining the results of the first byte-wise comparison in a second data path until a second byte-wise comparison is performed, wherein step e) comprises before selecting one of the first and second data elements performing the second byte-wise comparison between the second data element and the uncompressed data element, wherein the selection of step e) is performed based on the results of the first and second byte-wise comparisons.

According to one embodiment, step b) further comprises introducing a third pipeline delay for at least one clock cycle for maintaining the first data element in a second data path until the second data element is read, wherein the selection of step e) comprises performing a first byte-wise comparison between the first data element and the uncompressed data element and a second byte-wise comparison between the second data element and the uncompressed data element, wherein the selection is performed based on at least the results of the first and a second byte-wise comparisons.

According to one embodiment, the method further comprises before step a) initializing the main hash table and the victim hash table with invalid data elements, wherein an invalid data element comprises a validity bit having a value indicative of the data element being invalid.

According to one embodiment, the uncompressed data element further comprises a hash preload indication of whether the uncompressed data element is a valid or an invalid data element for the comparison of step e). This embodiment may allow for preloading the hash tables without producing valid output from step f). For example, hash preload bits may accompany every single byte of the uncompressed data element.

For example, the uncompressed data element further comprises a validity indication of whether the uncompressed data element is a valid or invalid data element.

According to one embodiment, the distributed memory further comprises a second victim hash table, and the method further comprises before step f): concurrently writing a third data element of the victim hash table being the first victim hash table to the second victim hash table, the third data element being overwritten by the first data element, if the third data element comprises an indication that it is a valid data element, using a fourth address generated by a third hash function from the third data element, and reading a fourth data element from the second victim hash table using a fifth address generated by the third hash function from the uncompressed data element; wherein a fourth pipeline delay for at least one clock cycle is used for maintaining the uncompressed data element in the first data path until the fourth data element is read from the second victim hash table, wherein selecting of step e) comprises selecting one of the first, second and fourth data elements having a longest sequence that matches at least part of the uncompressed data element.

This embodiment may further improve the compression ratio of a compressed data format of the data being processed by this embodiment which may further save storage space. This is because hash collisions at the first victim hash table may be avoided by moving an overwritten victim data element to the second victim hash table. This may increase the initial sample of data elements that is used for matching with the uncompressed data element. In other terms, the overwritten victim data element is still taken into account for matching with the uncompressed data element which may then increase the length of the matching sequence e.g. if the longest matching sequence is in the overwritten victim data element.

According to one embodiment, the fifth address is generated from a third portion of the uncompressed data element, wherein the second portion is encoded in the leftmost bytes of the third portion. For example, the first portion is encoded in the leftmost bytes of the third portion.

This embodiment may provide a reliable matching method that makes use of the hierarchy of three hash tables. Also, it may provide the longest matching sequence compared to other combinations of the third and second portions of the uncompressed data element.

According to one embodiment, a fifth and a sixth pipeline delay for at least one clock cycle is used for maintaining in the second and a third data path the results of the first and the second byte-wise comparison until a third byte-wise comparison is performed, wherein step e) further comprises before selecting one of the first, second and fourth data elements performing the third byte-wise comparison between the fourth data element and the uncompressed data element, wherein the selection is performed based on the results of the first, second and third byte-wise comparisons if the uncompressed data element and at least one of the first, second and fourth data elements are valid data elements.

According to one embodiment, the method further comprises receiving a subsequent uncompressed data element in the stream of data elements, the subsequent uncompressed data element following the uncompressed data element being a former uncompressed data element. The method further comprises: executing in parallel step c) on the former uncompressed data element and step a) on the subsequent uncompressed data element; and executing in parallel step e) on the former uncompressed data element and step c) on the subsequent uncompressed data element.

FIG. 1 shows a hardware block diagram 100 of a data processing system for finding a matching sequence of bytes for an uncompressed data element 105. The data processing system may comprise a hardware logic system having a multi-stage pipeline structure. For example, the hardware logic system may comprise a series of logic units. In another example, the data processing system may comprise a processor having a multi-stage pipeline structure.

FIG. 1 shows an example of a logic's three pipeline stages. For example, the hardware logic system may be built in a pipelined way, such that data D0 that arrives in clock cycle 0 will be available as D1 1-2 clock cycles later at clock cycle 1, and as D2 another 1-2 clock cycles later at clock cycle 2. For example, the uncompressed data element flowing through the data path 119, may arrive at clock cycle 0 (which is represented by D0) and will be available 1-2 clock cycles at clock cycle 1 (which is represented by D1) and another 1-2 clock cycles later at clock cycle 2 (which is represented by D2).

The uncompressed data element 105 may be received in a stream of data elements by the hardware logic system. Each data element in the stream of data elements comprises the offset of the data element within the stream of data elements. The offset may be implemented implicitly with a counter logic, or added to the data element.

The hardware logic system further comprises a distributed memory comprising a main hash table 101 and a victim hash table 103. The main hash table 101 and the victim hash table 103 may form a first and second level of a multi-level hash hierarchy.

The main 101 and the victim 103 hash table may be accessed using addresses that are generated by a first 107 and second 111 hash function respectively. An address may be generated from a predefined number of bytes. The number of output address bits depends on the size of the hash table being accessed. For example, the main hash table 101 may be used to find byte sequences with lengths >=3 bytes, therefore the address is generated from the first 3 bytes of the uncompressed data element; however, other lengths may be used.

Entries in the main hash table 101 that are about to be overwritten are written (moved) to the victim hash table 103 using the second hash function 111 based on more than 3 bytes of data. As a result, different byte sequences, both starting with the same 3 bytes, can coexist in the main hash table 101 and the victim hash table 103, and thus reducing hash collisions for similar byte sequences.

Before being used, the main hash table 101 as well as the victim hash table 103 may be initialized with invalid data elements. In the example of FIG. 1, the main hash table 101 is shown as containing an entry "ABCDEFGH" 109 from previous input data. The input data element "ABCDJLMN" 105 is used to search for a similar pattern in the main and victim hash tables 101 and 103. For that, the first hash function 107 uses the first three bytes "ABC" of the input data element 105 to generate an address 115 (of a memory location) in order to read the main hash table 101 at the generated address 115. However, that memory location contains a valid value i.e. the data element "ABCDEFGH" 109 that has been previously written. This means that the input data element 105 may overwrite the data element 109. This is because the calculated hash address for the two data elements 105 and 109 match. In this case, the data element 109 has to be read from the main hash table 101.

In parallel, to reading the data element 109 from the main hash table 101, the input data element 105 may be written into the main hash table 101 at the same generated address 115 in order to keep the main hash table 101 up-to-date with the latest input data. The input data element 105 is written into the main hash table 101 under the condition that it comprises an indication that it is a valid data element. The indication may comprise a bit that may be set to indicate the input data element 105 is a valid or invalid data element. As a consequence, the data element 109 will be overwritten in the main hash table 101, and may thus be lost for a subsequent comparison or usage. To avoid that loss, the read data element 109 is therefore saved in the victim hash table 103 which uses a different hash function i.e. the second hash function 111 which uses more input bytes e.g. at least 5 bytes to generate an address 117. Due to the longer input bytes and the different hash function, different values that would have the same address in the main hash table 101 may get stored in different locations in the victim hash table 103, and are thus both available for subsequent comparison with new input data. For example, the data elements "ABCDJYZA" 110 and "ABCDEFGH" 109 are stored at different locations in the victim hash table 103, even though in the main hash table 101, they would be stored in the same location.

The read and write operation to the main hash table 101 may be started in a single clock cycle 0. However, the read operation of the data element "ABCDEFGH" 109 from the main hash table 101 may have a latency of one or more clock cycles and returns the data element 109 before the write happened. In other words, the data element "ABCDEFGH" may be available for a next operation only after clock cycle 0+one or more clock cycles.

Therefore, a first pipeline delay 113A for at least one clock cycle is introduced for maintaining the input data element 105 in a first data path 119 until the data element 109 is read. In this way, the data elements 105 and 109 may be available at the start of the clock cycle 1 for further operations.

As soon as the data element 109 is available, it is written to the victim hash table 103, using address 117 generated by the second hash function 111 e.g. from the first 5 bytes "ABCDE" of the data element 109. In parallel to writing data element 109, the data element 110 is read from the victim hash table 103 using address 121 generated by the second hash function 111 from the 5 first bytes of the input data element 105. The purpose of reading the victim hash table 103 using address 121 is to search for another matching data element that matches at least part of the input data element 105.

The read and write operation to the victim hash table 103 may be performed in the clock cycle 1. However, the read operation of the data element 110 from the victim hash table 103 may have a latency of one or more clock cycles. In other words, the data element 110 may be available for a next operation only after clock cycle 1+one or more clock cycles.

Therefore, a second pipeline delay 113B for at least one clock cycle is introduced for maintaining the input data element 105 in the first data path 119 until the data element 110 is read. In this way, the data elements 105 and 110 may be available at the start of the clock cycle 2 for further operations.

As yet, two data elements "ABCDEFGH" 109 and "ABCDJYZA" 110 have been found as matching the input data element 105. Thus, a comparison between the three data elements 105, 109 and 110 is to be performed in order to select the data element that has a longer matching sequence with the input data element 105.

In order to perform the comparison, there are at least two options:
- comparing the data element 105 with both data element 109 and data element 110 at the same time e.g. in clock cycle 2. This means that the three data elements 105, 109 and 110 is to be available at the time when the comparison is to be performed, or
- comparing the data element 105 with data element 109 already in the clock cycle 1 and comparing the data element 105 with data element 110 in clock cycle 2. This means that in order to select one of the data elements 109 and 110, the results 125 of the first comparison 127 is to be available at the time when the selection is to be performed.

For the first option, a third pipeline delay for at least one clock cycle is to be introduced for maintaining the data element 109 in a second data path 123 until the data element 110 is read.

For the second option, a fourth pipeline delay 113c for at least one clock cycle is to be introduced for maintaining the results 125 of the first comparison 127 between the data element 105 and the data element 109 in the second data path 123 until the data element 110 is read or until the second comparison between the input data element 105 and data element 110 is performed. In other terms, the results 125 and 131 of the comparisons 127 and 129 are to be available during the clock cycle 2, where the comparison and the selection are performed.

The first 127 and second 129 comparisons may be byte-wise comparisons which may result for example in sets of bits 125 and 131 respectively. And, the set of bits having longer sequences of '1' may be selected and a corresponding data element i.e. in this case "ABCDJYZA" 110 may be used for providing the input data element 105 in a compressed format backward referring to the longest matching sequence i.e. "ABCDJ". For example, the data element 105 in a compressed format may be represented as follows "[d,5]LMN", where d and 5 refer to the distance d at which the 5 bytes may be found in the input stream of data elements.

A victim hash function with a five byte input as shown with reference to FIG. 1 will calculate the same address for the same five-byte input. Therefore, for multiple byte strings starting with the same five bytes, only the latest one will stay in that victim hash table 103. Depending on the typical input data and in order to increase the matching efficiency it may be useful to add more stages of victim hash tables to prevent conflicts between longer byte sequences starting with the same bytes.

Figure 2:
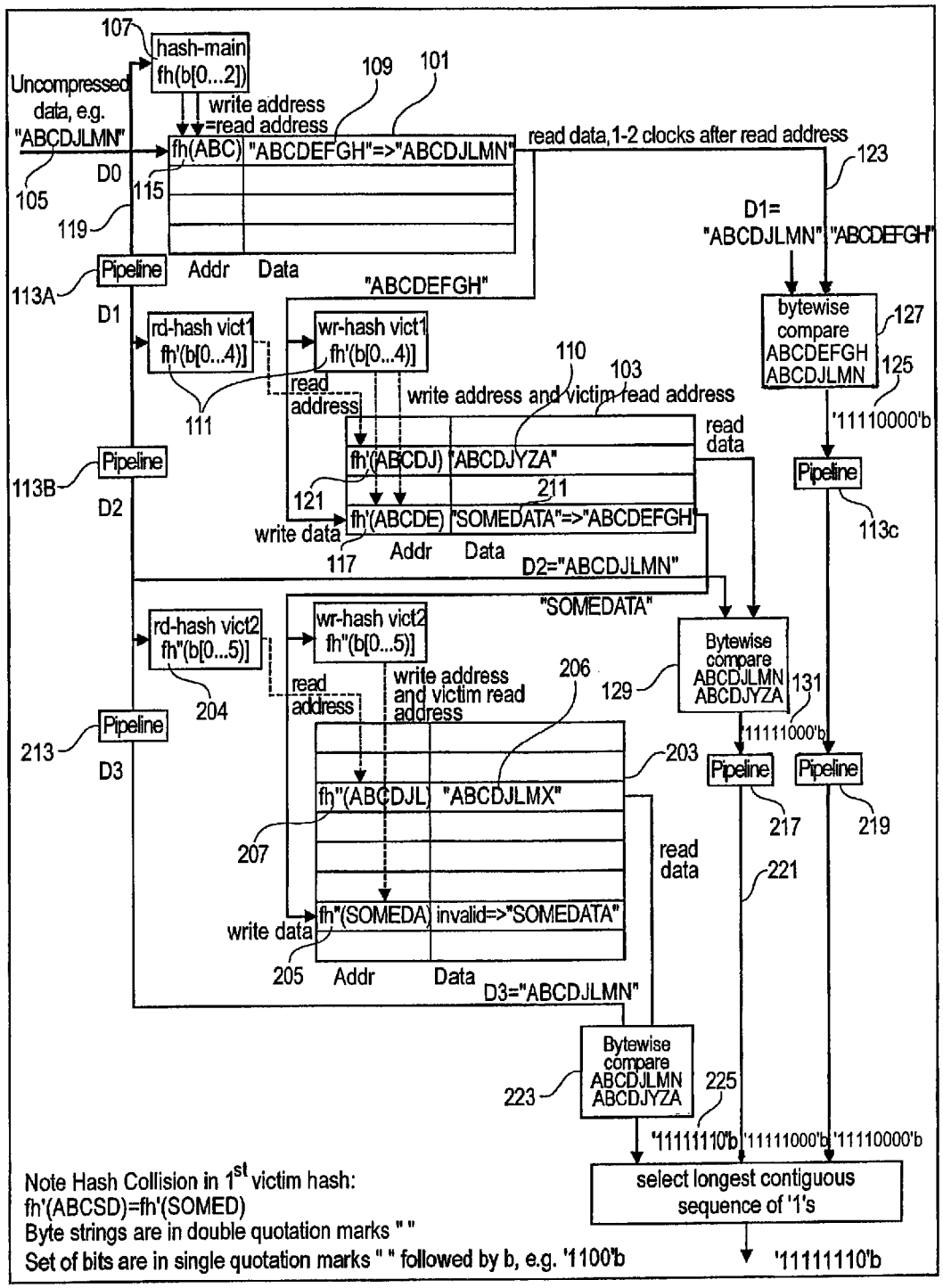
FIG. 2 is a second exemplary hardware block diagram of a data processing system for processing an uncompressed data element.

The hardware block diagram of FIG. 2 shows a second victim hash table 203 in addition to the elements of FIG. 1. In contrast to the victim hash table 103, the second victim hash table 203 may be accessed with a third hash function 204 using more than 5 input bytes in order to calculate an address.

For example, a hash collision may happen in the victim hash table 103 because the address 117 where the data element 109 is written is the same as the address generated from the data element "SOMEDATA" 211 by the second hash function 111. That is, the "SOMEDATA" 211 will be overwritten in victim hash table 103. Therefore, it has to be written in the second victim hash table 203 with an address 205 that is generated by the third hash function 204 from the first 6 bytes of the data element "SOMEDATA" 211. In parallel to writing "SOMEDATA" 211 in the second victim hash table 203, the second victim hash table 203 is read using an address 207 generated by the third hash function 204 from the 6 first bytes of the input data element 105. The read and write operation of the second victim hash table 203 may be performed in clock cycle 3.

However, the read operation of the data element "ABCDJLMX" 206 from the second victim hash table 203 may have a latency of one or more clock cycles. In other words, the data element 206 may be available for a next operation only after clock cycle 2+one or more clock cycles.

Therefore, a pipeline delay 213 for at least one clock cycle is introduced for maintaining the input data element 105 in the first data path 119 until the data element 206 is read. In this way, the data elements 105 and 206 may be available at the start of clock cycle 3 for further operations.

As yet, three data elements 109, 110 and 206 have been found as matching the input data element 105. Thus, a comparison between the four data elements 105, 109, 110 and 206 is to be performed in order to select the data element that has a longer matching sequence with the input data element 105.

For example, in order to perform the comparison, other pipeline delays 217 and 219 may be introduced in order to maintain the results 125 of the first comparison 127 in the second data path 123 and to maintain the results 131 of the second comparison 129 in a third data path 221 until data element 206 is read and a third comparison 223 between the input data element 105 and the data element 206 is performed.

The third comparison 223 may be a byte-wise comparison that results in the set of bits 225. And, one of the set of bits 125, 131 and 225 having longer sequences of '1' may be selected, and the corresponding data element i.e. in this case "ABCDJLMX" 206 may be used for providing the input data element 105 in a compressed format backward referring to the longest matching sequence i.e. "ABCDJLM".

Figure 3:
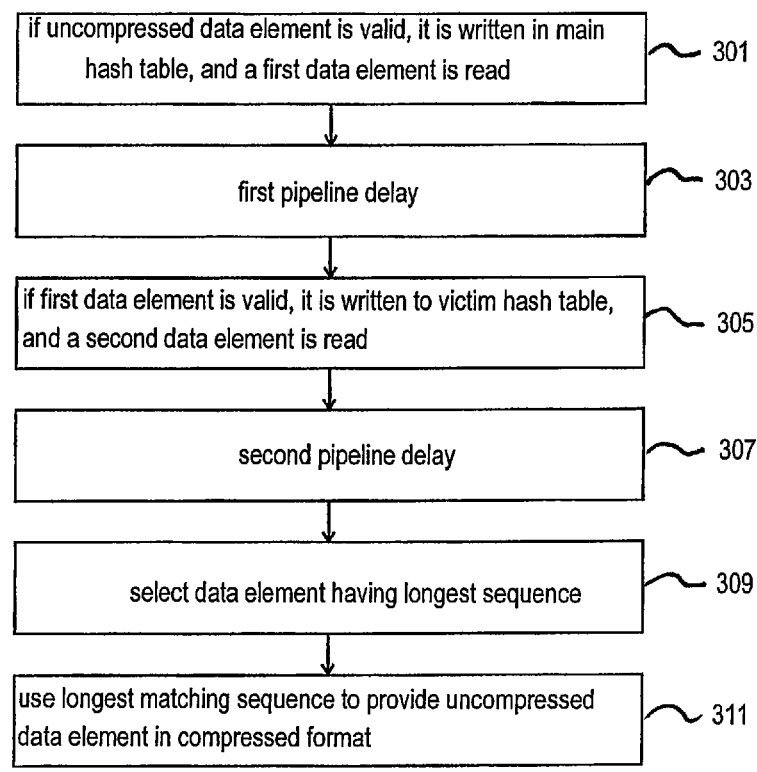
FIG. 3 is one example of a flowchart of a method for processing an uncompressed data element.

FIG. 3 is a flowchart of a method for processing an uncompressed data element e.g. data element 105 received in a stream of data elements by a hardware logic system having a multi-stage pipeline structure and a distributed memory comprising a main hash table e.g. 101, and at least one victim hash table e.g. 103.

In step 301, if the uncompressed data element comprises an indication that it is a valid data element, it is written in the main hash table using a first address generated by the first hash function from the uncompressed data element and a first data element is concurrently read from the main hash table using the first address. For example, the uncompressed data element may comprise a validity bit. The validity bit may be set to a value 1 if the uncompressed data element is valid or may be set to a value 0 if the uncompressed data element is invalid. For example, the validity bit may accompany every single byte of the uncompressed data element.

In step 303, a first pipeline delay for at least one clock cycle is introduced for maintaining the uncompressed data element in a first data path until the first data element is read.

In step 305, if the first data element comprises an indication that it is a valid data element it is written to the victim hash table using a second address generated by the second hash function from the first data element, and a second data element is concurrently read from the victim hash table using a third address generated by the second hash function from the uncompressed data element. For example, the first data element may comprise a validity bit. The validity bit may be set to a value 1 if the first data element is valid or may be set to a value 0 if the first data element is invalid.

In step 307, a second pipeline delay for at least one clock cycle is introduced for maintaining the uncompressed data element in the first data path until the second data element is read.

In step 309, a data element is selected from at least the first and second data elements having a longest sequence that matches at least part of the uncompressed data element, if the uncompressed data element and at least one of the first and second data elements are valid data elements. For example, in step 309, if at least one data element of two data elements being compared is invalid, the comparison may yield an invalid result which means "no match found", either because the uncompressed data element is invalid, or because one or both of the main hash table and the victim hash table did not yet have a matching entry that matches the uncompressed data element (i.e. in other terms if one or both of the first end second data elements are invalid data elements).

In step 311, the longest matching sequence is used for providing the uncompressed data element in a compressed format backward referring to the longest matching sequence.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may be, for instance, a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in the form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

It is understood that one or more of the aforementioned embodiments may be combined as long as the combined embodiments are not mutually exclusive.

What is claimed is:

1. A method of processing an uncompressed data element received in a stream of data elements by a hardware logic system having a multi-stage pipeline structure and a distributed memory comprising a main hash table and at least one victim hash table, the method comprising:
   a) concurrently writing the uncompressed data element, based on the uncompressed data element comprising an indication that it is a valid data element, in the main hash table using a first address generated by a first hash function from the uncompressed data element, and reading a first data element from the main hash table using the first address;
   b) introducing a first pipeline delay for at least one clock cycle for maintaining the uncompressed data element in a first data path until the first data element is read;
   c) concurrently writing the first data element to a victim hash table of the at least one victim hash table, based on the first data element comprising an indication that it is a valid data element, using a second address generated by a second hash function from the first data element, and reading a second data element from the victim hash table using a third address generated by the second hash function from the uncompressed data element;
   d) introducing a second pipeline delay for at least one clock cycle for maintaining the uncompressed data element in the first data path until the second data element is read;
   e) selecting a data element from at least the first and second data elements having a longest sequence that matches at least part of the uncompressed data element, based on the uncompressed data element and at least one of the first and second data elements comprising an indication that they are valid data elements; and
   f) using the longest sequence that matches for providing the uncompressed data element in a compressed format backward referring to the longest sequence that matches.

2. The method of claim 1, wherein the first address is generated from a first portion of the uncompressed data element and the third address is generated from a second portion of the uncompressed data element, and wherein the first portion is encoded in one or more leftmost bytes of the second portion.

3. The method of claim 1, wherein steps a), c), e) and f) are processed at a rate of one step per clock cycle.

4. The method of claim 1, wherein step c) further comprises concurrently performing a first byte-wise comparison between the first data element and the uncompressed data element, and introducing after step c) a third pipeline delay for at least one clock cycle for maintaining results of the first byte-wise comparison in a second data path until a second byte-wise comparison is performed, wherein step e) comprises before selecting one of the first and second data elements performing the second byte-wise comparison between the second data element and the uncompressed data element, wherein the selection of step e) is performed based on results of the first and second byte-wise comparisons.

5. The method of claim 1, wherein step b) further comprises introducing a third pipeline delay for at least one clock cycle for maintaining the first data element in a second data path until the second data element is read, wherein the selection of step e) comprises performing a first byte-wise comparison between the first data element and the uncompressed data element and a second byte-wise comparison between the second data element and the uncompressed data element, wherein the selection is performed based on at least results of the first and the second byte-wise comparisons.

6. The method of claim 1, further comprising before step a) initializing the main hash table and the victim hash table with invalid data elements, wherein an invalid data element comprises a validity bit having a value indicative of the data element being invalid.

7. The method of claim 1, wherein the uncompressed data element further comprise a hash preload indication of whether the uncompressed data element is a valid or an invalid data element for the comparison of step e).

8. The method of claim 1, wherein the victim hash table is a first victim hash table, the distributed memory further comprises a second victim hash table, and the method further comprises before step f): concurrently writing a third data element to the second victim hash table, the third data element being overwritten by the first data element, based on the third data element comprising an indication that it is a valid data element, using a fourth address generated by a third hash function from the third data element, and reading a fourth data element from the second victim hash table using a fifth address generated by the third hash function from the uncompressed data element; wherein another pipeline delay for at least one clock cycle is used for maintaining the uncompressed data element in the first data path until the fourth data element is read from the second victim hash table, wherein selecting of step e) comprises selecting one of the first, second and fourth data elements having a longest sequence that matches at least part of the uncompressed data element.

9. The method of claim 8, wherein the fifth address is generated from a third portion of the uncompressed data element, wherein the second portion is encoded in one or more leftmost bytes of the third portion.

10. The method of claim 8, wherein a third and a fourth pipeline delay for at least one clock cycle is used for maintaining in the second data path and a third data path results of a first and a second byte-wise comparison until a third byte-wise comparison is performed, the first byte-wise comparison being between the first data element and the uncompressed data element and the second byte-wise comparison being between the second data element and the uncompressed data element, wherein step e) further comprises before selecting one of the first, second and fourth data elements performing the third byte-wise comparison between the fourth data element and the uncompressed data element, wherein the selection is performed based on results of the first, second and third byte-wise comparisons based on the uncompressed data element and at least one of the first, second and fourth data elements being valid data elements.

11. The method of claim 1, further comprising receiving a subsequent uncompressed data element in the stream of data elements, the subsequent uncompressed data element following in the stream of data elements the uncompressed data element, the uncompressed data element being a former uncompressed data element, the method further comprising:
   executing in parallel step c) on the former uncompressed data element and step a) on the subsequent uncompressed data element; and executing in parallel step e) on the former uncompressed data element and step c) on the subsequent uncompressed data element.

12. A data processing system for processing an uncompressed data element received in a stream of data elements, the data processing system comprising a hardware logic system having a multi-stage pipeline structure and a distributed memory comprising a main hash table and at least one victim hash table, the data processing system being adapted to:
   a) concurrently write the uncompressed data element, based on the uncompressed data element comprising an indication that it is a valid data element, in the main hash table using a first address generated by a first hash function from the uncompressed data element, and reading a first data element from the main hash table using the first address;
   b) introduce a first pipeline delay for at least one clock cycle for maintaining the uncompressed data element in a first data path until the first data element is read;
   c) concurrently write the first data element to a victim hash table of the at least one victim hash table, based on the first data element comprising an indication that it is a valid data element, using a second address generated by a second hash function from the first data element, and reading a second data element from the victim hash table using a third address generated by the second hash function from the uncompressed data element;
   d) introduce a second pipeline delay for at least one clock cycle for maintaining the uncompressed data element in the first data path until the second data element is read;
   e) select a data element from at least the first and second data elements having a longest sequence that matches at least part of the uncompressed data element, based on the uncompressed data element and at least one of the first and second data elements comprising an indication that they are valid data elements; and
   f) use the longest sequence that matches for providing the uncompressed data element in a compressed format backward referring to the longest sequence that matches.

13. The data processing system of claim 12, wherein step c) further comprises concurrently performing a first byte-wise comparison between the first data element and the uncompressed data element, and introducing after step c) a third pipeline delay for at least one clock cycle for maintaining results of the first byte-wise comparison in a second data path until a second byte-wise comparison is performed, wherein step e) comprises before selecting one of the first and second data elements performing the second byte-wise comparison between the second data element and the uncompressed data element, wherein the selection of step e) is performed based on results of first and second byte-wise comparisons.

14. The data processing system of claim 12, wherein step b) further comprises introducing a third pipeline delay for at least one clock cycle for maintaining the first data element in a second data path until the second data element is read, wherein the selection of step e) comprises performing a first byte-wise comparison between the first data element and the uncompressed data element and a second byte-wise comparison between the second data element and the uncompressed data element, wherein the selection is performed based on at least results of the first and the second byte-wise comparisons.

15. The data processing system of claim 12, wherein the victim hash table is a first victim hash table, the distributed memory further comprises a second victim hash table, and the method further comprises before step f): concurrently writing a third data element to the second victim hash table, the third data element being overwritten by the first data element, based on the third data element comprising an indication that it is a valid data element, using a fourth address generated by a third hash function from the third data element, and reading a fourth data element from the second victim hash table using a fifth address generated by the third hash function from the uncompressed data element; wherein another pipeline delay for at least one clock cycle is used for maintaining the uncompressed data element in the first data path until the fourth data element is read from the second victim hash table, wherein selecting of step e) comprises selecting one of the first, second and fourth data elements having a longest sequence that matches at least part of the uncompressed data element.

16. A computer program product for processing an uncompressed data element received in a stream of data elements by a hardware logic system having a multi-stage pipeline structure and a distributed memory comprising a main hash table and at least one victim hash table, the computer program product comprising:
   a computer readable storage medium readable by a processing circuit and storing instructions for execution by the processing circuit for performing a method comprising:
      a) concurrently writing the uncompressed data element, based on the uncompressed data element comprising an indication that it is a valid data element, in the main hash table using a first address generated by a first hash function from the uncompressed data element, and reading a first data element from the main hash table using the first address;
      b) introducing a first pipeline delay for at least one clock cycle for maintaining the uncompressed data element in a first data path until the first data element is read;
      c) concurrently writing the first data element to a victim hash table of the at least one victim hash table, based on the first data element comprising an indication that it is a valid data element, using a second address generated by a second hash function from the first data element, and reading a second data element from the victim hash table using a third address generated by the second hash function from the uncompressed data element;
      d) introducing a second pipeline delay for at least one clock cycle for maintaining the uncompressed data element in the first data path until the second data element is read;
      e) selecting a data element from at least the first and second data elements having a longest sequence that matches at least part of the uncompressed data element, based on the uncompressed data element and at least one of the first and second data elements comprising an indication that they are valid data elements; and
      f) using the longest sequence that matches for providing the uncompressed data element in a compressed format backward referring to the longest sequence that matches.

17. The computer program product of claim 16, wherein step c) further comprises concurrently performing a first byte-wise comparison between the first data element and the uncompressed data element, and introducing after step c) a third pipeline delay for at least one clock cycle for maintaining results of the first byte-wise comparison in a second data path until a second byte-wise comparison is performed, wherein step e) comprises before selecting one of the first and second data elements performing the second byte-wise comparison between the second data element and the uncompressed data element, wherein the selection of step e) is performed based on results of the first and second byte-wise comparisons.

18. The computer program product of claim 16, wherein step b) further comprises introducing a third pipeline delay for at least one clock cycle for maintaining the first data element in a second data path until the second data element is read, wherein the selection of step e) comprises performing a first byte-wise comparison between the first data element and the uncompressed data element and a second byte-wise comparison between the second data element and the uncompressed data element, wherein the selection is performed based on at least results of the first and the second byte-wise comparisons.

19. The computer program product of claim 16, wherein the victim hash table is a first victim hash table, the distributed memory further comprises a second victim hash table, and the method further comprises before step f): concurrently writing a third data element to the second victim hash table, the third data element being overwritten by the first data element, based on the third data element comprising an indication that it is a valid data element, using a fourth address generated by a third hash function from the third data element, and reading a fourth data element from the second victim hash table using a fifth address generated by the third hash function from the uncompressed data element; wherein another pipeline delay for at least one clock cycle is used for maintaining the uncompressed data element in the first data path until the fourth data element is read from the second victim hash table, wherein selecting of step e) comprises selecting one of the first, second and fourth data elements having a longest sequence that matches at least part of the uncompressed data element.

20. The computer program product of claim 19, wherein a third and a fourth pipeline delay for at least one clock cycle is used for maintaining in the second data path and a third data path results of a first and a second byte-wise comparison until a third byte-wise comparison is performed, the first byte-wise comparison being between the first data element and the uncompressed data element and the second byte-wise comparison being between the second data element and the uncompressed data element, wherein step e) further comprises before selecting one of the first, second and fourth data elements performing the third byte-wise comparison between the fourth data element and the uncompressed data element, wherein the selection is performed based on results of the first, second and third byte-wise comparisons based on the uncompressed data element and at least one of the first, second and fourth data elements being valid data elements.

* * * * *